(12) United States Patent
Frank et al.

(10) Patent No.: US 8,805,652 B2
(45) Date of Patent: Aug. 12, 2014

(54) CHARGE CALIBRATOR AND SYSTEM INCORPORATING THE SAME

(75) Inventors: John M. Frank, Hartville, OH (US); Artan Duraj, Seven Hills, OH (US)

(73) Assignee: Saint-Gobain Ceramics & Plastics, Inc., Worcester, MA (US)

(*) Notice: Subject to any disclaimer, the term of this patent is extended or adjusted under 35 U.S.C. 154(b) by 574 days.

(21) Appl. No.: 12/479,168

(22) Filed: Jun. 5, 2009

(65) Prior Publication Data

US 2009/0302224 A1    Dec. 10, 2009

Related U.S. Application Data

(60) Provisional application No. 61/058,948, filed on Jun. 5, 2008.

(51) Int. Cl.
| | | |
|---|---|---|
| G06F 17/50 | (2006.01) | |
| G06F 7/60 | (2006.01) | |
| G06F 13/10 | (2006.01) | |
| G06F 11/26 | (2006.01) | |

(52) U.S. Cl.
CPC .......... *G06F 13/105* (2013.01); *G06F 11/261* (2013.01); *G06F 17/50* (2013.01)
USPC .......... 703/2; 703/3; 703/5; 702/179

(58) Field of Classification Search
USPC .......... 703/2, 3, 5; 702/179; 250/370.11, 250/390.11
See application file for complete search history.

(56) References Cited

U.S. PATENT DOCUMENTS

| | | | | |
|---|---|---|---|---|
| 4,658,222 A | * | 4/1987 | Wolf et al. | 331/78 |
| 5,491,342 A | * | 2/1996 | Lim et al. | 250/363.09 |
| 5,545,898 A | * | 8/1996 | Gagnon et al. | 250/369 |
| 5,834,779 A | * | 11/1998 | Shao et al. | 250/363.03 |
| 5,990,482 A | * | 11/1999 | Bertelsen et al. | 250/363.04 |
| 6,008,493 A | * | 12/1999 | Shao et al. | 250/363.04 |
| 6,362,472 B1 | * | 3/2002 | Yarnall et al. | 250/252.1 |
| 6,420,711 B2 | * | 7/2002 | Tumer | 250/370.09 |
| 6,448,560 B1 | * | 9/2002 | Tumer | 250/370.09 |
| 6,559,440 B2 | * | 5/2003 | Yarnall et al. | 250/252.1 |
| 6,704,385 B1 | * | 3/2004 | Reichenauer | 376/257 |
| 7,034,310 B2 | * | 4/2006 | Tumer | 250/370.09 |
| 7,060,983 B2 | * | 6/2006 | Tumer | 250/370.09 |
| 7,132,664 B1 | * | 11/2006 | Crosetto | 250/367 |
| 7,180,055 B1 | | 2/2007 | Kallenbach et al. | |
| 7,211,800 B2 | * | 5/2007 | Arseneau | 250/363.09 |
| 7,232,990 B2 | * | 6/2007 | Wang et al. | 250/252.1 |
| 7,345,284 B2 | * | 3/2008 | Tumer | 250/370.09 |
| 7,355,167 B2 | * | 4/2008 | Arseneau | 250/252.1 |
| 7,446,308 B2 | * | 11/2008 | Gilchrist et al. | 250/269.1 |
| 7,462,816 B2 | * | 12/2008 | Arseneau | 250/252.1 |

(Continued)

OTHER PUBLICATIONS

Cardoso et al. "Optimization of Digital Spectrometers using a Pulse Streaming Generator", IEEE 2004.*

(Continued)

*Primary Examiner* — Shambhavi Patel
(74) *Attorney, Agent, or Firm* — Abel Law Group, LLP; Robert N. Young

(57) ABSTRACT

A charge calibrator for simulating the output of a scintillation detector. The calibrator includes a processor for executing a Gaussian random number generator algorithm to produce an output comprising a Gaussian random number distribution having at least one characteristic established in response to a user input.

22 Claims, 3 Drawing Sheets

(56) References Cited

U.S. PATENT DOCUMENTS

| | | | |
|---|---|---|---|
| 7,544,927 B1 * | 6/2009 | Iwatschenko-Borho ... | 250/252.1 |
| 7,566,879 B2 * | 7/2009 | Tumer ..................... | 250/370.1 |
| 7,569,810 B1 * | 8/2009 | Troxler et al. ............ | 250/269.1 |
| 7,579,598 B2 * | 8/2009 | Lenox et al. ............. | 250/363.03 |
| 8,089,043 B2 * | 1/2012 | Casey et al. ............... | 250/252.1 |
| 2004/0136486 A1 * | 7/2004 | Reichenauer ................ | 376/257 |
| 2007/0085014 A1 * | 4/2007 | McIntyre et al. ........... | 250/367 |
| 2010/0065746 A1 * | 3/2010 | Grazioso et al. ......... | 250/363.04 |

OTHER PUBLICATIONS

Simoes et al. "A Mixed Analog-Digital Spectrometer", Dec. 2002.*
"Gaussian Distribution with Specified Mean and Sigma", 2003.*
Gliere, A. "Sindbad: From Cad Model to Synthetic Radiographs", 2005.*
Vici et al. "Fast pulsed UV light source and calibration of non-linear photomultiplier response", Nuclear Instruments and Methods in Physics Research A 507 (2003) 636-642.*
Wentzloff, et al. "Gaussian Pulse Generators for Subbanded Ultra-Wideband Transmitters", IEEE Transactions on Microwave Theory and Techniques, vol. 54, No. 4, Apr. 2006.*
Menshikov, et al. "Fast Gain Calibration of Photomultiplier and Electronics", 2002.*
Bellamy et al. "Absolute calibration and monitoring of a spectrometric channel using a photomultiplier", Nuclear Instruments and Methods in Physics Research A 339 (1994) 468-476.*
Random Pulse Generator Model DB-2, Berkeley Nucleonics Corp., downloaded from the Internet Sep. 9, 2009, 2 pages, http://bnc.helpserve.com/index.php?_m=downloads&_a=view&parentcategoryid=144&pcid=0&nav=0.
D.W. Burtis et al., A Random Tail Pulse Generator, downloaded from the Internet Sep. 9, 2009, http://bnc.helpserve.com/index.php?_m=downloads&_a=view&parentcategoryid=144&pcid=0&nav=0.
Model DB-2 random pulse generator, BNC Products, 2009, downloaded from Internet Sep. 9, 2009, 2 pages, http://www.berkeleynucleonics.com/products/model-db2.html.
Sensors & Electronics—Electronics & Systems—Portable "Calibrator" Test Instrument (370), downloaded from Internet Sep. 9, 2009, 2 pages, http://www.technet.pnl.gov/sensors/electronics/projects/ES4RadDVDInstr.stm.
Sensors & Electronics—Electronics & Systems—Field "Calibrator" for Radiation Instruments (369), downloaded from Internet Sep. 9, 2009, 2 pages, http://www.technet.pnl.gov/sensors/electronics/projects/ES4Rad-DVDSeq.stm.
Saint-Gobain Crystals, Performance Resolution (excerpt from the Saint-Gobain Crystals Scintillation Detector Operating Manual), Technical Information Note Document #517, Downloaded on Apr. 30, 2010, 1 page.
Saint-Gobain Crystals, "Measuring Radiation: An Introductory Discussion," Bicron, Crismatec, Saint-Gobain Ceramics & Plastics, Inc., dated 2004, 12 pages.

* cited by examiner

CHARGE CALIBRATOR AND SYSTEM INCORPORATING THE SAME

CROSS-REFERENCE TO RELATED APPLICATION

This application claims the benefit of U.S. Provisional Patent Application Ser. No. 61/058,948 filed on Jun. 5, 2008, the disclosure of which is fully incorporated herein by reference.

TECHNICAL FIELD

The present disclosure relates to nuclear energy measurement systems and more particularly, to a charge calibrator and a system incorporating the same.

BACKGROUND INFORMATION

Scintillation detectors are generally used to detect radiation that is not easily detected by conventional photodetectors. A scintillator or scintillation crystal absorbs the radiation and converts the energy of the radiation to a light pulse. The light may be converted to electrons (i.e., an electron current) in a photomultiplier tube, which amplifies the electron current. The output of one or more scintillation detectors may be coupled to a nuclear energy measurement system for measuring and/or monitoring the detected radiation in various industries and applications including medical (e.g., to produce images of internal organs), geophysical (e.g., to measure radioactivity of the earth), inspection (e.g., non-destructive, non-invasive testing), research (e.g., to measure the energy of photons and particles), and health physics (e.g., to monitor radiation in the environment as it affects humans).

SUMMARY

Consistent with one aspect of the present disclosure there is provided a method of simulating the output of a scintillation detector, the method including: receiving a user input; and executing a Gaussian random number generator algorithm in a processor to produce digital output including a Gaussian random number distribution having at least one characteristic established in response to the user input.

Consistent with another aspect of the present disclosure there is provided a charge calibrator for simulating the output of a scintillation detector. The charge calibrator includes a processor, and a computer readable medium storing instructions for causing the processor to produce a digital output including a Gaussian random number distribution having at least one characteristic established in response to a user input.

Consistent with yet another aspect of the present disclosure, there is provided a system including a nuclear energy measurement system, and a charge calibrator coupled to the nuclear energy measurement system for simulating the output of a scintillation detector. The charge calibrator includes a processor and a computer readable medium storing instructions for causing the processor to produce a digital output including a Gaussian random number distribution having at least one characteristic established in response to a user input.

BRIEF DESCRIPTION OF THE DRAWINGS

These and other features and advantages will be better understood by reading the following detailed description, taken together with the drawings wherein.

DETAILED DESCRIPTION

Development and deployment of a nuclear energy measurement system may involve testing and calibration of the system's capability to accurately measure or monitor radiation detected by a scintillation detector. One approach to system testing and calibration may be to provide an actual radioactive source and scintillation detector, the output of which is provided as a calibration input to the system under test. Differing test conditions between successive tests, however, can make correlation of test results difficult. Also, in some cases, scintillation detectors and sources may exhibit significant output variability due to manufacturing tolerances of the components thereof. It can be especially difficult, therefore, to correlate test results when different sources and detectors are used for successive tests, or when multiple detectors and sources are used in a single test.

In general, a charge calibrator consistent with embodiments described herein may provide an output that simulates the output of a scintillation detector used to detect a source of radiation. The simulated scintillation detector output may be standardized among multiple similarly manufactured charge calibrators to provide a known standard for use in testing and calibrating nuclear energy measurement systems. Correlation of testing and calibration results for such systems may be facilitated through use of a standardized test signal provided by the charge calibrator.

Figure 1:
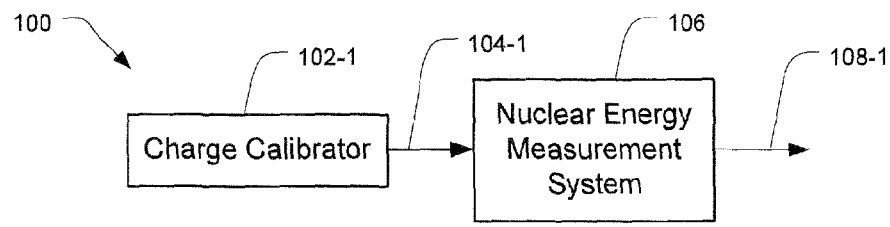
FIG. 1 is a block diagram illustrating one exemplary embodiment of a system consistent with the present disclosure.

FIG. 1 illustrates one exemplary embodiment 100 of a system consistent with the present disclosure. The illustrated exemplary embodiment includes a charge calibrator 102-1 consistent with the present disclosure coupled to a known nuclear energy measurement system 106. As used herein, the term "coupled" may refer to either mechanical, electrical or optical coupling and does not imply a direct coupling or connection unless otherwise specified.

The charge calibrator may be configured to provide an associated output 104-1 to the nuclear measurement system 106. The output of the charge calibrator 102-1 may simulate the output of a scintillation detector and radiation source pair. The nuclear energy measurement system 106 may provide an output 108-1 in response to the output of the charge calibrator 102-1.

Consistent with the present disclosure, the charge calibrator 102-1 may produce an output that simulates the output of a scintillation detector and radiation source pair and is a mathematical function of user inputs for adjusting adjustable characteristics of the simulated output, such as pulse height resolution (PHR), charge target, count rate, and scintillator type. Since the output of the charge calibrator 102-1 is a mathematical function of user inputs, the output of the calibrator, and any similarly constructed calibrator, may be reliably reproduced. This allows use of the calibrator configuration for calibrating performance of the nuclear energy measurement system and/or for confirming performance of a nuclear energy measurement system, without requiring testing of calibrator outputs to ensure accurate setting.

Figure 1A:
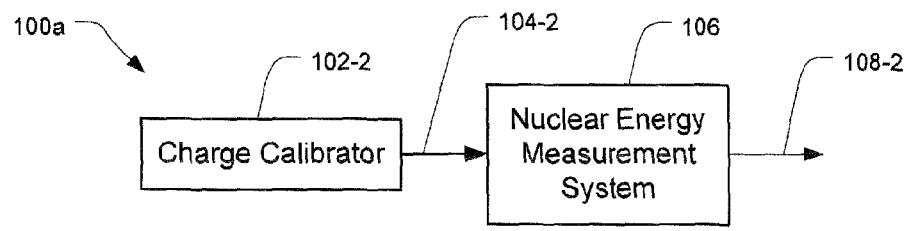
FIG. 1A is a block diagram illustrating another exemplary embodiment of a system consistent with the present disclosure.

With reference to FIGS. 1 and 1A, for example, the system 100 may be provided in a first physical location, e.g. a manufacturing facility, for calibrating the nuclear energy measurement system 106 using the output of the charge calibrator 102-1. The nuclear energy measurement system 106 may then be transported to a second location, e.g. a customer location, different from the first location. As illustrated in FIG. 1A, at the second location a system 100a may be assembled to re-calibrate the nuclear energy measurement system 106 and/or confirm performance of the nuclear energy measurement system 106.

The system 100a may include a charge calibrator 102-2 consistent with the present disclosure coupled to the nuclear energy measurement system 106. The charge calibrator may 102-2 may be a separate charge calibrator from the charge calibrator 102-1, but may have the same construction. The calibrator 102-2 may provide an associated output 104-2 to the nuclear measurement system 106, and the nuclear energy measurement system 106 may provide an output 108-2 in response to the output of the charge calibrator 102-2.

Consistent with the present disclosure, the user inputs for charge calibrator 102-2 may be placed at the same settings as those used for the charge calibrator 102-1 when initially calibrating the nuclear energy management system 106. With the same settings for the calibrators 102-1 and 102-2, the calibrators reliably provide nearly identical (within about 1%) outputs 104-2 and 104-1, respectively, without requiring confirmation of accuracy of the outputs through testing, and regardless of differing operating conditions or environment. This provides an ability to repeatably simulate a desired detector output using the same or different charge calibrators, thereby allowing reliable correlation of test results between successive tests of a nuclear energy measurement system 106.

Figure 2:
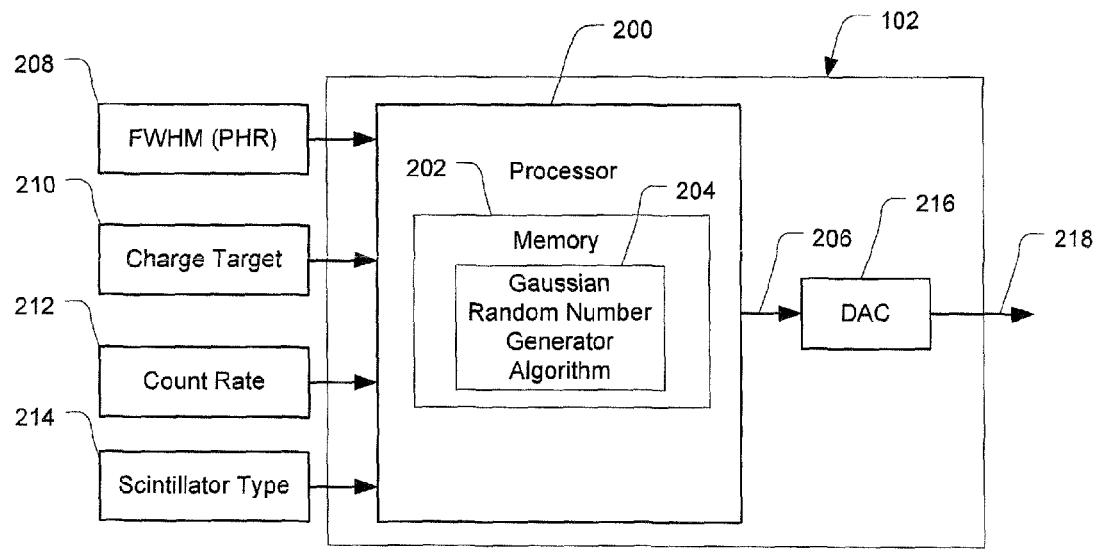
FIG. 2 is a block diagram illustrating one exemplary embodiment of a charge calibrator consistent with the present disclosure.

FIG. 2 illustrates one exemplary embodiment of a charge calibrator 102 consistent with the present disclosure. The illustrated exemplary embodiment includes a processor 200 and a computer readable memory 202. The processor 200 may be may be configured for executing a Gaussian random number generator algorithm 204. The Gaussian random number generator algorithm 204 may be executed by the processor to produce a digital output 206 that is a mathematical function of user inputs 208, 210, 212, 214 for setting a full width at half maximum (FWHM), charge target, count rate, and scintillator type, respectively, and/or predefined values for the inputs. The digital output 206 may be coupled to a known digital-to-analog converter (DAC) 216, and the output 218 of the DAC may be provided as the charge calibrator output.

The processor 200 may be a general purpose processor, a digital signal processor (DSP), an application specific integrated circuit (ASIC), a field programmable gate array (FPGA) or other programmable logic device designed to execute the Gaussian random number generator algorithm 204 in response to the user inputs. A general-purpose processor may be a microprocessor, but, in the alternative, the processor may be any conventional processor, controller, microcontroller, or state machine. The processor may also be implemented as a combination of computing devices, e.g., a combination of a DSP and a microprocessor, a plurality of microprocessors, one or more microprocessors in conjunction with a DSP core, or any other such configuration.

The Gaussian random number generator algorithm 204 may take a variety of configurations known to those of ordinary skill in the art. The algorithm 204 may be stored in memory 202 and may be implemented as a series of software instructions to be executed by the processor 200 to cause the processor to produce a series of random numbers at the output 206 in a uniform Gaussian distribution that may be manipulated by setting a mean value, standard deviation, a limit on the total number of random numbers to be generated, and a range for the values of the numbers. The memory 202 may be a RAM memory, flash memory, ROM memory, EPROM memory, EEPROM memory, registers, a hard disk, a removable disk, or any other form of computer readable storage medium known in the art. The memory 202 may be coupled to the processor 200 or may be integral to the processor.

As is known to those of ordinary skill in the art, the output of a detector and radiation source pair may be represented by a histogram including a Gaussian peak. In general, radiation imparted on a scintillation crystal may cause the crystal to scintillate and emit pulses of light. The light pulses may be imparted on a photomultiplier which converts the light pulses to electrical pulses representative of the light pulses. The electrical pulses may be detected by a multi-channel analyzer and the number of pulses having a given energy level may be recorded and a histogram of the number of counts of pulses at a given energy level (or multi-channel analyzer channel) may be developed.

Figure 3:
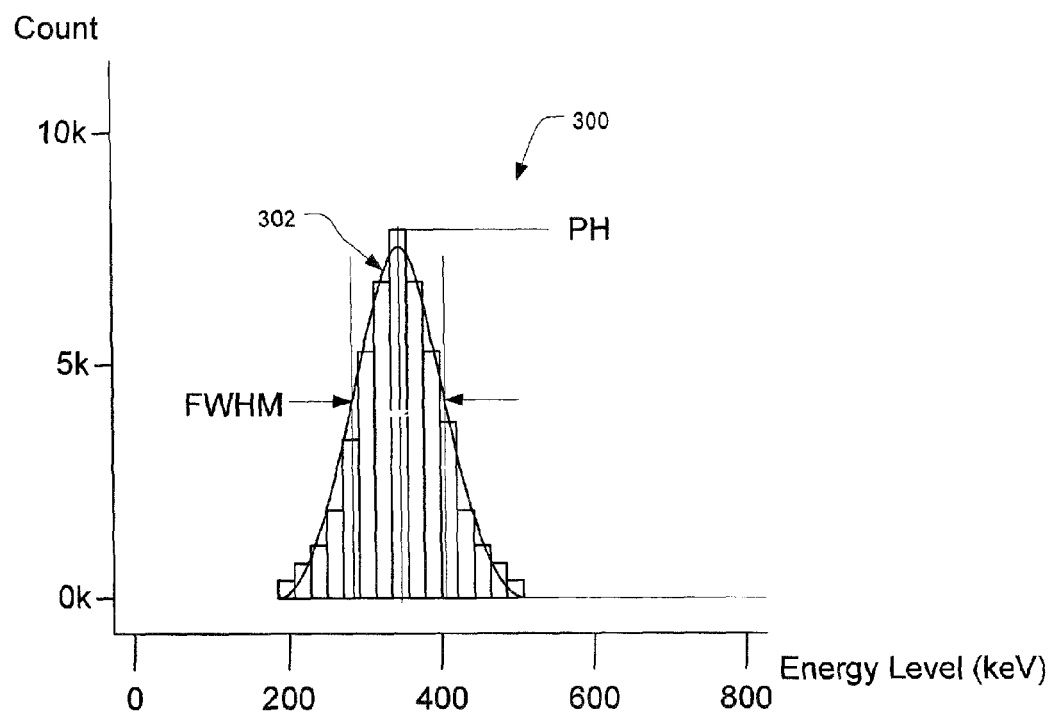
FIG. 3 is a histogram of count vs. energy level illustrating an exemplary output of a scintillator and detector pair.

FIG. 3 includes a histogram 300 of count vs. energy level in kilo-electron volts (keV) associated with an exemplary detector and radiation source pair. In the histogram 300, the peak pulse height PH may be understood as the pulse height of the channel providing the highest number of counts. The full width at half maximum (FWHM) may be understood as the full width of the pulse 302 at half the peak pulse height and may an indication of the width of the peak. The number of particles or photons that impinge the detector in a given period of time, e.g. per second, may be understood as the count rate.

With reference again to FIG. 2, user inputs 208, 210, 212, 214 to the Gaussian random number generator algorithm 204 may be selected to produce a charge calibrator output 218 that simulates a histogram of a detector and radiation source pair with a desired, pulse height, FWHM, count rate and/or scintillator type. For example, the FWHM input 208 may provide a standard deviation setting for the Gaussian random number generator algorithm 204, the Charge Target input 210, which defines the mean charge output of the peak of the Gaussian distribution, may be a limiting input as to the maximum output defined by the electronics, the Count Rate input 212 may be a limiting input as to the total number of random numbers to be generated by the Gaussian random number generator algorithm 204, and/or the Scintillator Type input 214 may provide different pulse characteristics such as but not limited to rise time and rise shape as well as decay time and decay shape. By appropriately setting one or more of the user inputs, the charge calibrator output 218 may simulate the output provided by a detector including a common scintillation crystal, such as thallium doped sodium iodide (NaI(Tl)) or thallium doped cesium iodide (CsI(Tl)), barium fluoride, cerium-doped lanthanum chloride (LaCl$_3$(Ce)), bismuth germinate (Bi$_4$Ge$_3$O$_{12}$), cerium-doped yttrium aluminum garnet (Ce:YAG), cerium-doped lanthanum bromide (LaBr$_3$(Ce)), lutetium iodide (LuI$_3$), terbium-doped gadolinium oxysulfide (GOS(Tb)), calcium tungstate ($CaWO_4$), cadmium tungstate ($CdWO_4$), lead tungstate ($PbWO_4$), zinc tungstate ($ZnWO_4$) lutetium oxyorthosilicate ($Lu_2SiO_5$), etc.

In addition or alternatively, the Scintillator Type input 214 may be used to implement predefined settings for simulating the output of a selected detector and radiation source pair. For example, FWHM, count rate and mean value (charge target) settings associated with each of a plurality of detector and radiation source pairs may be stored in memory 202. The Scintillator Type input 214 may be configured to allow a user to select a group of such settings to set the output 218 of the charge calibrator to simulate an associated detector and radiation source pair. In addition or alternatively, groups of such settings may be provided to the Scintillator Type input 214 from an external source, e.g. user input device.

Figure 4:
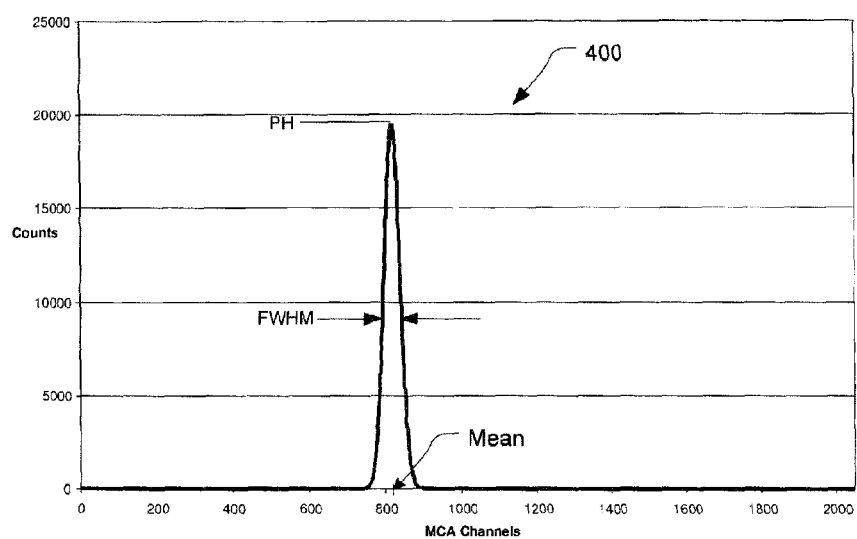
FIG. 4 is a histogram of count vs. energy level (given as multi-channel analyzer channel) associated with an exemplary charge calibrator consistent with the present disclosure.

FIG. 4 includes a histogram 400 of count vs. energy level (given as multi-channel analyzer channel) associated with an exemplary charge calibrator 102 consistent with the present disclosure. The illustrated exemplary histogram exhibits a FWHM, count rate and mean value (charge target) established in response to the user inputs 208, 210, 212, 214.

Figure 5:
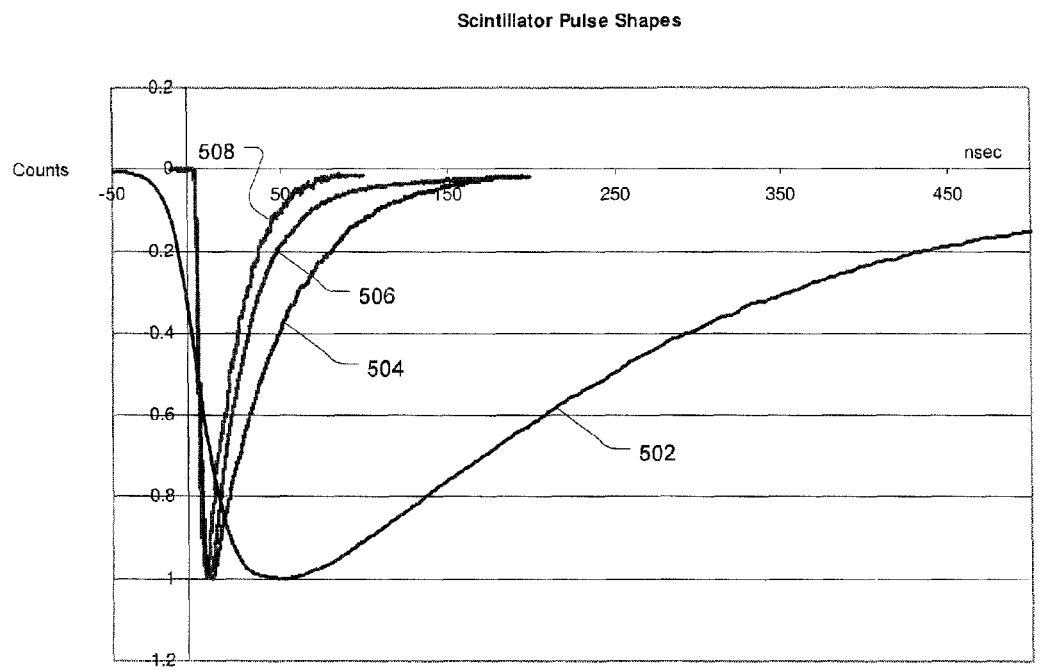
FIG. 5 includes histograms of count vs. time in nanoseconds (nsec) associated with an exemplary charge calibrator consistent with the present disclosure.

FIG. 5 includes histograms 502, 504, 506, and 508 of count vs. time in nanoseconds (nsec) associated with an exemplary charge calibrator 102 consistent with the present disclosure illustrating different simulated detector pulse shapes established by appropriately setting one or more of the user inputs. Plot 502 illustrates a simulated output associated with a detector including a NaI(Tl) crystal. Plots 504, 506, and 509 illustrate a simulated outputs associated with separate detectors including a P420™, B350™ and B380™ brand scintillation crystals, respectively, which are commercially available from Saint-Gobain Crystals.

A charge calibrator consistent with the present disclosure may thus produce a reliable and repeatable output that simulates the output of any scintillation detector and radiation source pair and is a result of the Gaussian random number generator algorithm given user inputs for adjusting the adjustable characteristics, such as pulse height resolution (PHR), charge target, count rate, and scintillator type. The outputs of similarly manufactured charge calibrators consistent with the present disclosure may be nearly identical, e.g. within about 1% variation. Separate charge calibrators, e.g. at different locations, may therefore be reliably implemented for calibrating a nuclear energy measurement system and/or for confirming performance of a nuclear energy measurement system, without requiring testing of calibrator outputs to ensure accurate setting and regardless of varying operating conditions or environment.

Figure 6:
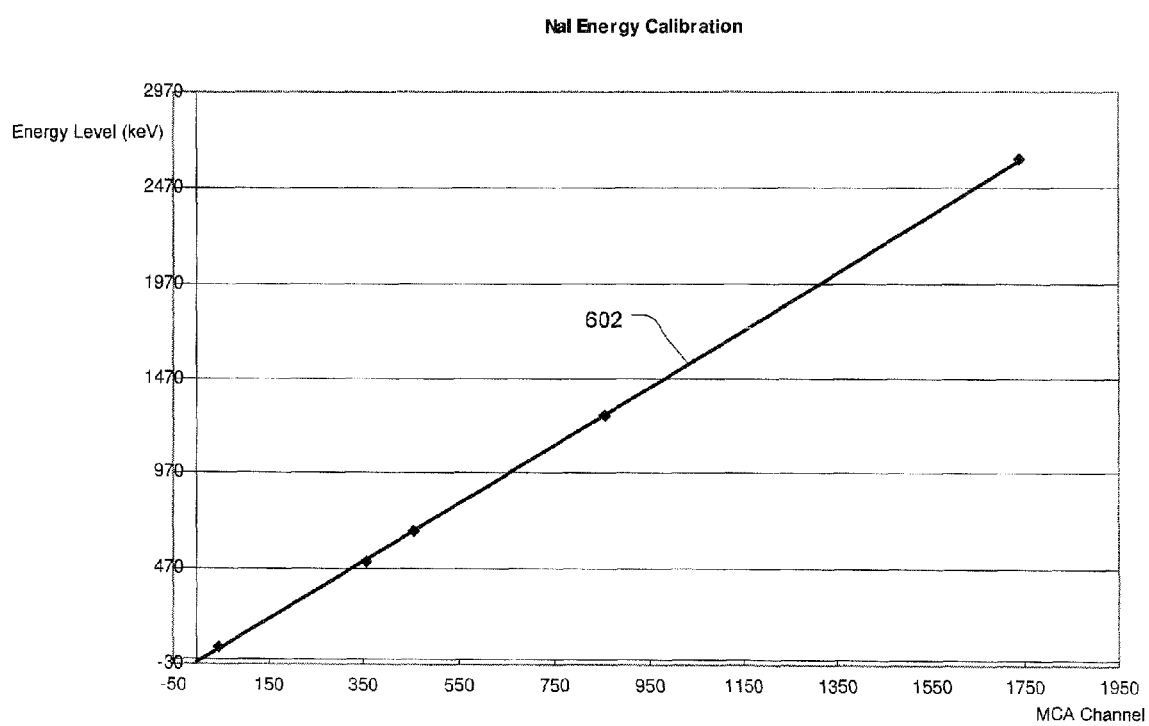
FIG. 6 includes a plot of energy level vs. multi-channel analyzer (MCA) channel associated with a detector including a NaI(Tl) crystal.

A charge calibrator consistent with the present disclosure also allows calibration to be conducted without the non-linearities associated with conventional detectors. With reference to FIG. 6, for example, there is shown a plot of energy level (keV) vs. multi-channel analyzer (MCA) channel associated with a detector including a NaI(Tl) crystal. As shown, the plot exhibits a non-linearity in crossing the y-axis at a value of about −20.114. Each detector and MCA has its own associated non-linearities. These non-linearities make it difficult to calibrate a nuclear energy measurement system in separate locations using separate detectors and MCAs. Charge calibrators consistent with the present disclosure, however, produce repeatable simulated outputs that do not exhibit the differing non-linearities associated with separate detectors and MCAs. Separate charge calibrators consistent with the present disclosure, may, therefore be used to reliably calibrate the same nuclear measurement system, e.g. in different locations.

While the principles of the invention have been described herein, it is to be understood by those skilled in the art that this description is made only by way of example and not as a limitation as to the scope of the invention. Other embodiments are contemplated within the scope of the present invention in addition to the exemplary embodiments shown and described herein. Modifications and substitutions by one of ordinary skill in the art are considered to be within the scope of the present invention, which is not to be limited except by the following claims.

What is claimed is:

1. A method comprising:
coupling a charge calibrator to a nuclear energy measurement system;
receiving a user input at said charge calibrator;
executing a Gaussian random number generator algorithm in a processor of the charge calibrator to produce a digital output comprising a Gaussian random number distribution having at least one characteristic established in response to said user input, wherein said digital output simulates a digital output corresponding to an output pulse of a photomultiplier representative of a scintillating light pulse received by the photomultiplier; and
calibrating said nuclear energy measurement system over a plurality of energy levels that include a lower energy level and an upper energy level that are separated by at least 450 keV/photon, wherein calibrating is performed using said charge calibrator.

2. A method according to claim 1, said method further comprising converting said digital output to an analog version of said digital output, wherein said analog version of said digital output simulates said output of said photomultiplier, wherein said analog version is received by said nuclear energy measurement system.

3. A method according to claim 1, said method comprising receiving a plurality of said user inputs and wherein said Gaussian random number distribution has a plurality of said characteristics established in response to associated ones of said user inputs, said characteristics comprising a full width at half maximum value of said Gaussian random number distribution, a mean value of said Gaussian random number distribution, pulse rise time of said Gaussian random number distribution, and pulse decay characteristics of said Gaussian random number distribution.

4. A method according to claim 1, wherein said at least one characteristic comprises a full width at half maximum value of said Gaussian random number distribution.

5. A method according to claim 1, wherein said at least one characteristic comprises a pulse rise time or a pulse decay time of said Gaussian random number distribution.

6. A method according to claim 1, further comprising determining a non-linearity of channel versus energy level for a multichannel analyzer, where said energy measurement system comprises said multichannel analyzer.

7. A charge calibrator comprising:
a processor; and
a computer readable medium storing instructions for causing said processor to produce a digital output comprising a Gaussian random number distribution having at least one characteristic established in response to a user input, wherein said digital output of the processor of the charge calibrator simulates a digital output corresponding to an output pulse of a photomultiplier representative of a scintillating light pulse received by the photomultiplier; and
a digital to analog converter coupled to said processor for converting said digital output to an analog version of said digital output, wherein said analog version of said digital output simulates said output pulse of said photomultiplier.

8. A charge calibrator according to claim 7, wherein said analog version includes information corresponding to counts at a plurality of energy levels that include a lower energy level and an upper energy level that are separated by at least 450 keV/photon.

9. A charge calibrator according to claim 7, wherein said Gaussian random number distribution has a plurality of said characteristics established in response to associated user inputs, said characteristics comprising a full width at half maximum value of said Gaussian random number distribution, a mean value of said Gaussian random number distribution, pulse rise time of said Gaussian random number distribution, and pulse decay characteristics of said Gaussian random number distribution.

10. A charge calibrator according to claim 7, wherein said at least one characteristic comprises a full width at half maximum value of said Gaussian random number distribution.

11. A charge calibrator according to claim 7, wherein said at least one characteristic comprises a pulse rise time or a pulse decay time of said Gaussian random number distribution.

12. A charge calibrator according to claim 7, wherein said user input includes a scintillator type selected from a plurality of scintillator types that are supported by the charge calibrator.

13. A system comprising:
a charge calibrator comprising:
a processor; and
a computer readable medium storing instructions for causing said processor to produce a digital output comprising a Gaussian random number distribution having at least one characteristic established in response to a user input, wherein said digital output simulates a digital output corresponding to an output pulse of a photomultiplier representative of a scintillating light pulse received by the photomultiplier; and
a multichannel analyzer having an input coupled to an output of the charge calibrator,
wherein the system is configured to provide an output of energy level for a plurality of energy levels, which include a lower energy level and an upper energy level that are separated by at least 450 keV/photon, as a function of channel number of said multichannel analyzer.

14. A system according to claim 13, said charge calibrator further comprising a digital to analog converter coupled to said processor, wherein:
an input of said digital to analog converter is coupled to said processor;
an output of said digital to analog converter is coupled to said multichannel analyzer;
said digital to analog converter is configured to convert said digital output to an analog version of said digital output; and
said analog version of said digital output simulates said output pulse of said photomultiplier.

15. A system according to claim 13, wherein said Gaussian random number distribution has a plurality of said characteristics established in response to different associated user inputs, said characteristics comprising a full width at half maximum value of said Gaussian random number distribution, a mean value of said Gaussian random number distribution, pulse rise time of said Gaussian random number distribution, and pulse decay characteristics of said Gaussian random number distribution.

16. A system according to claim 13, wherein said at least one characteristic comprises a full width at half maximum value of said Gaussian random number distribution.

17. A system according to claim 13, wherein said at least one characteristic comprises a pulse height value of said Gaussian random number distribution.

18. A system according to claim 13, wherein said at least one characteristic comprises a mean value of said Gaussian random number distribution.

19. A system according to claim 13, wherein said user input includes a scintillator type selected from a plurality of scintillator types that are supported by the charge calibrator.

20. A method according to claim 2, wherein said user input includes a scintillator type selected from a plurality of scintillator types that are supported by the charge calibrator.

21. A system according to claim 14, wherein said multichannel analyzer is configured to output counts for particular channel numbers of said multichannel analyzer.

22. A method according to claim 7, wherein the charge calibrator does not exhibit non-linearities associated with conventional detectors.

* * * * *